(12) United States Patent
Takano

(10) Patent No.: US 10,332,759 B2
(45) Date of Patent: Jun. 25, 2019

(54) PROCESSING APPARATUS

(71) Applicant: Kabushiki Kaisha Toshiba, Minato-ku, Tokyo (JP)

(72) Inventor: Masamune Takano, Kanazawa Ishikawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 303 days.

(21) Appl. No.: 14/927,326

(22) Filed: Oct. 29, 2015

(65) Prior Publication Data
US 2016/0300736 A1    Oct. 13, 2016

(30) Foreign Application Priority Data

Apr. 10, 2015   (JP) ................. 2015-080861

(51) Int. Cl.
| | | |
|---|---|---|
| *H01L 21/67* | (2006.01) | |
| *B24C 1/00* | (2006.01) | |
| *B24C 3/22* | (2006.01) | |
| *B24C 3/06* | (2006.01) | |
| *B24C 3/32* | (2006.01) | |

(52) U.S. Cl.
CPC ........ *H01L 21/67051* (2013.01); *B24C 1/003* (2013.01); *B24C 3/065* (2013.01); *B24C 3/22* (2013.01); *B24C 3/322* (2013.01); *H01L 21/6715* (2013.01)

(58) Field of Classification Search
CPC .......... B08B 5/02; B08B 5/023; B24C 1/003; B24C 3/065; B24C 3/22; B24C 3/322; B24C 7/0015; B24C 7/0046; B24C 7/0053; B24C 9/003; H01L 5/02; H01L 5/023
See application file for complete search history.

(56) References Cited

U.S. PATENT DOCUMENTS

| | | | |
|---|---|---|---|
| 5,279,075 A | | 1/1994 | Sage et al. |
| 5,558,110 A | * | 9/1996 | Williford, Jr. ............ B08B 3/02 |
| | | | 134/148 |
| 5,762,538 A | * | 6/1998 | Shaffer .................... B24B 1/00 |
| | | | 408/144 |
| 5,888,883 A | | 3/1999 | Sasaki et al. |
| 5,931,721 A | | 8/1999 | Rose et al. |

(Continued)

FOREIGN PATENT DOCUMENTS

| | | |
|---|---|---|
| CN | 1502118 A | 6/2004 |
| JP | H8-298252 A | 11/1996 |

(Continued)

OTHER PUBLICATIONS

Korean Office Action dated May 31, 2016 by the Korean Intellectual Property Office in counterpart Korean patent application No. 10-2015-0110515, along with English translation thereof.

(Continued)

*Primary Examiner* — Timothy V Eley
(74) *Attorney, Agent, or Firm* — White & Case LLP

(57) ABSTRACT

A processing apparatus of an embodiment includes a stage that can have a sample placed thereon, a rotation mechanism that rotates the stage, a first nozzle that injects a substance onto the sample, and a second nozzle that supplies fluid to the rotation center of the sample.

12 Claims, 9 Drawing Sheets

(56) References Cited

U.S. PATENT DOCUMENTS

| | | | |
|---|---|---|---|
| 5,997,653 A * | 12/1999 | Yamasaka | B08B 3/02 |
| | | | 134/102.1 |
| 6,012,968 A * | 1/2000 | Lofaro | B24B 53/017 |
| | | | 451/39 |
| 6,203,406 B1 | 3/2001 | Rose et al. | |
| 6,247,479 B1 * | 6/2001 | Taniyama | B08B 3/024 |
| | | | 134/133 |
| 6,383,331 B1 * | 5/2002 | Sumnitsch | B05B 15/10 |
| | | | 118/302 |
| 6,419,566 B1 | 7/2002 | Palmisano | |
| 6,500,758 B1 | 12/2002 | Bowers | |
| 6,565,920 B1 | 5/2003 | Endisch | |
| 6,653,210 B2 | 11/2003 | Choo et al. | |
| 6,790,289 B2 * | 9/2004 | Takase | B08B 7/04 |
| | | | 134/1 |
| 6,960,119 B1 | 11/2005 | Said | |
| 7,790,578 B2 | 9/2010 | Furui | |
| 7,806,076 B2 * | 10/2010 | Yamamoto | H01L 21/6715 |
| | | | 118/681 |
| 7,901,514 B2 * | 3/2011 | Nakamura | B08B 3/02 |
| | | | 134/18 |
| 8,043,469 B2 * | 10/2011 | Nakamori | H01L 21/02019 |
| | | | 156/345.21 |
| 8,113,221 B2 * | 2/2012 | Nanba | B08B 3/02 |
| | | | 134/149 |
| 8,147,617 B2 * | 4/2012 | Sekiguchi | B08B 3/02 |
| | | | 134/18 |
| 2003/0121511 A1 | 7/2003 | Hashimura et al. | |
| 2004/0140298 A1 | 7/2004 | Widmann et al. | |
| 2004/0140300 A1 | 7/2004 | Yoshikawa | |
| 2005/0106782 A1 | 5/2005 | Genda et al. | |
| 2006/0191556 A1 * | 8/2006 | Nakazawa | H01L 21/67017 |
| | | | 134/2 |
| 2006/0276006 A1 | 12/2006 | Yang et al. | |
| 2007/0114488 A1 | 5/2007 | Jackson | |
| 2008/0006302 A1 | 1/2008 | Araki et al. | |
| 2008/0213978 A1 | 9/2008 | Henry et al. | |
| 2009/0101181 A1 * | 4/2009 | Morisawa | H01L 21/67028 |
| | | | 134/94.1 |
| 2010/0044873 A1 | 2/2010 | Kameyama | |
| 2010/0136766 A1 | 6/2010 | Sakamoto et al. | |
| 2011/0265815 A1 | 11/2011 | Mitake et al. | |
| 2012/0247504 A1 | 10/2012 | Nasr et al. | |
| 2012/0322240 A1 | 12/2012 | Holden et al. | |
| 2013/0084658 A1 | 4/2013 | Vaupel et al. | |
| 2013/0084659 A1 | 4/2013 | Martens et al. | |
| 2013/0167947 A1 | 7/2013 | Nakano et al. | |
| 2013/0199726 A1 | 8/2013 | Kim et al. | |
| 2013/0217228 A1 | 8/2013 | Kodera et al. | |
| 2013/0267076 A1 | 10/2013 | Lei et al. | |
| 2014/0020846 A1 | 1/2014 | Hirakawa et al. | |
| 2014/0182634 A1 | 7/2014 | Ishibashi | |
| 2014/0261570 A1 | 9/2014 | Orii et al. | |
| 2015/0020850 A1 | 1/2015 | Kato et al. | |
| 2015/0034900 A1 | 2/2015 | Aihara | |
| 2015/0104929 A1 | 4/2015 | Lei et al. | |
| 2015/0255316 A1 | 9/2015 | Dobashi et al. | |
| 2016/0141200 A1 | 5/2016 | Takano | |
| 2016/0141209 A1 | 5/2016 | Takano | |
| 2016/0218037 A1 | 7/2016 | Takano | |
| 2016/0358768 A1 | 12/2016 | Kodera et al. | |
| 2017/0032984 A1 * | 2/2017 | Ito | B08B 3/10 |
| 2017/0084480 A1 * | 3/2017 | Mizutani | H01L 21/76814 |
| 2017/0090291 A1 * | 3/2017 | Yoshihara | G03F 7/3021 |

FOREIGN PATENT DOCUMENTS

| | | |
|---|---|---|
| JP | 2000-058546 A | 2/2000 |
| JP | 2000-117201 A | 4/2000 |
| JP | 2001-044143 A | 2/2001 |
| JP | 3636835 B2 | 4/2005 |
| JP | 2007-142277 A | 6/2007 |
| JP | 2007-250620 A | 9/2007 |
| JP | 2007-258640 A | 10/2007 |
| JP | 2008-141135 A | 6/2008 |
| JP | 52-15269 B2 | 6/2013 |
| JP | 2013-138089 A | 7/2013 |
| JP | 2013-201424 A | 10/2013 |
| JP | 2013-222822 A | 10/2013 |
| JP | 2014-072383 A | 4/2014 |
| JP | 2014-090127 A | 5/2014 |
| JP | 2014-130884 A | 7/2014 |
| JP | 2014-159052 A | 9/2014 |
| KR | 20090039629 A | 4/2009 |
| KR | 20130115681 A | 10/2013 |
| TW | 200529308 A | 9/2005 |
| TW | 200641985 A | 12/2006 |
| TW | 200811942 A | 3/2008 |
| TW | 201312676 A | 3/2013 |
| TW | 201448018 A | 12/2014 |
| TW | 201507020 A | 2/2015 |

OTHER PUBLICATIONS

Non-Final Office Action received in U.S. Appl. No. 14/928,482 dated Sep. 28, 2016.

Non-Final Office Action received in U.S. Appl. No. 14/927,326 dated Apr. 6, 2017.

* cited by examiner

PROCESSING APPARATUS

CROSS-REFERENCE TO RELATED APPLICATION

This application is based upon and claims the benefit of priority from Japanese Patent Application No. 2015-080861, filed on Apr. 10, 2015, the entire contents of which are incorporated herein by reference.

FIELD

Embodiments described herein relate generally to a processing apparatus.

BACKGROUND

Semiconductor devices formed on a semiconductor substrate such as a wafer are divided into semiconductor chips by dicing along a dicing region formed on the semiconductor substrate. In a case where a metal film to be the electrodes of the semiconductor devices, or a resin film such as a die bonding film is formed on one surface of the semiconductor substrate, the metal film or the resin film in the dicing region also needs to be removed at the time of dicing.

As a method of removing the metal film or the resin film, there is a method of removing a metal film or a resin film at the same time as a semiconductor substrate by blade dicing, for example. In this case, shape abnormalities such as protrusions (burrs) are likely to occur in the metal film or the resin film. Where the metal film or the resin film has shape abnormalities, the semiconductor chips might fail the external appearance test, or junction defects might occur between beds and the semiconductor chips. As a result, the production yield becomes lower.

DETAILED DESCRIPTION

Figure 1A:
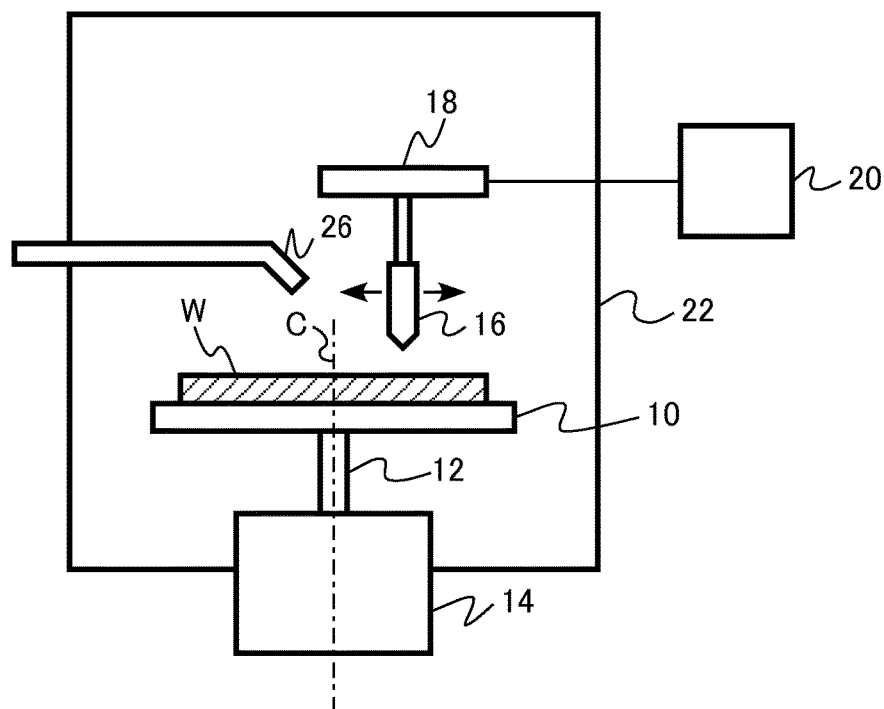
FIGS. 1A and 1B are schematic views of a processing apparatus according to a first embodiment.

A processing apparatus of an embodiment includes: a stage that can have a sample placed thereon; a rotation mechanism that rotates the stage; a first nozzle that injects a substance onto the sample; and a second nozzle that supplies fluid to the rotation center of the sample.

The following is a description of embodiments, with reference to the accompanying drawings. In the description below, like components are denoted by like reference numerals, and explanation of components described once will not be repeated.

First Embodiment

A processing apparatus of this embodiment includes: a stage that can have a sample placed thereon; a rotation mechanism that rotates the stage; a first nozzle that injects a substance onto the sample; and a second nozzle that supplies fluid to the rotation center of the sample. The processing apparatus further includes: a movement mechanism that moves the stage and the first nozzle in a relative manner in a direction perpendicular to the rotation axis of the stage; and a control unit that controls the movement mechanism.

The processing apparatus of this embodiment is a semiconductor manufacturing apparatus to be used in dicing a semiconductor substrate, for example. For example, the processing apparatus of this embodiment is used in a case where a metal film provided on one of the surfaces of a semiconductor substrate and is to be the electrodes or the like of semiconductor devices is removed at the time of dicing.

In this embodiment, an example case where the substance to be injected onto the metal film is particles containing carbon dioxide is described. The particles containing carbon dioxide (hereinafter also referred to simply as carbon dioxide particles) are particles containing carbon dioxide as a principal component. In addition to carbon dioxide, the particles may contain inevitable impurities, for example.

Figure 1B:
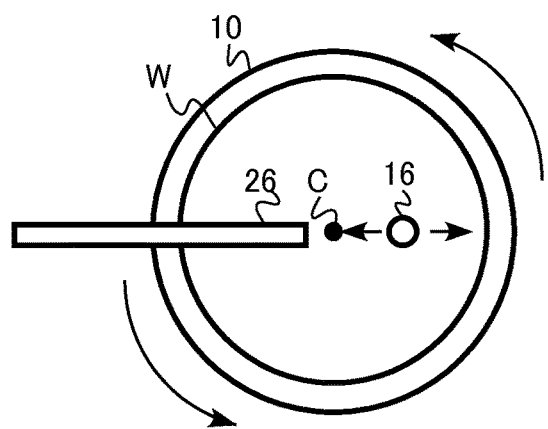

FIGS. 1A and 1B are schematic views of the processing apparatus of this embodiment. FIG. 1A is a schematic diagram including a cross-section of the apparatus. FIG. 1B is a top view of the stage area.

The semiconductor manufacturing apparatus of this embodiment includes a stage 10, a support shaft 12, a rotation mechanism 14, a first nozzle 16, a movement mechanism (a first movement mechanism) 18, a control unit 20, a processing chamber 22, and a second nozzle 26.

The stage 10 is designed so that the sample W to be process can be placed thereon. For example, a semiconductor wafer bonded to a dicing sheet secured to a dicing frame is placed on the stage 10.

The stage 10 is secured to the support shaft 12. The rotation mechanism 14 rotates the stage 10. The rotation mechanism 14 includes a motor and a bearing that rotatably holds the support shaft 12, for example. The stage 10 is rotated about a rotation axis C by the rotation mechanism 14.

Carbon dioxide particles for removing the metal film are injected from the first nozzle 16. As the metal film is removed with the injected carbon dioxide particles, the sample W is divided, for example. The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The first nozzle 16 is connected to a liquefied carbon dioxide tank (not shown), for example. Carbon dioxide particles are generated by adiabatically expanding and solidifying the liquefied carbon dioxide in the tank. The first nozzle 16 is connected to a supply source (not shown) of a nitrogen gas or compressed air, for example. The generated carbon dioxide particles, together with a nitrogen gas or compressed air, for example, are injected from the first nozzle 16 toward the sample W placed on the stage 10.

The diameter of the first nozzle 16 is not smaller than φ1 mm and not greater than φ3 mm, for example. The distance between the first nozzle 16 and the surface of the sample W is not shorter than 10 mm and not longer than 20 mm, for example.

The direction of the injecting of the carbon dioxide particles from the first nozzle 16 is substantially perpendicular to the surface of the stage 10, for example.

As indicated by arrows in FIGS. 1A and 1B, the movement mechanism 18 linearly moves the stage 10 and the first nozzle 16 in a relative manner in a direction perpendicular to the rotation axis C of the stage 10. For example, the first nozzle 16 is moved so as to scan between the rotation axis C of the stage 10 and the edge of the sample W. In the case illustrated in FIGS. 1A and 1B, the first nozzle 16, not the stage 10, is moved by the movement mechanism 18.

The movement mechanism 18 is not particularly limited, as long as it can linearly scan the first nozzle 16 relative to the stage 10. For example, a belt-driven shuttle mechanism formed with a combining of a belt, a pulley, and a motor for rotating the pulley is used. Alternatively, a combination of a rack-and-pinion mechanism and a motor is used, for example. Also, a linear motor may be used, for example.

The movement mechanism 18 may move the stage 10 relative to a fixed first nozzle 16, instead of the first nozzle 16.

The control unit 20 controls the movement mechanism 18. The control unit 20 controls the scan range of the first nozzle 16 on the stage 10, the velocity of the first nozzle 16 relative to the stage 10, and the like to become desired values, for example. The control unit 20 may be hardware such as a circuit board, or may be a combination of hardware and software such as a control program stored in a memory. The control unit 20 may control the movement mechanism 18 in synchronization with the rotation mechanism 14. The control unit 20 also moves the stage 10 and the first nozzle 16 in a relative manner in a direction parallel to the surface of the stage 10, for example.

The second nozzle 26 supplies fluid to a region including at least the rotation center of the sample W. The fluid is water, for example. As water is supplied to the rotation center of the rotating sample W, a water coating is formed on the entire surface of the sample W.

A housing 22 houses the stage 10, the first nozzle 16, the movement mechanism 18, the second nozzle 26, and the like. The housing 22 protects the stage 10, the first nozzle 16, the movement mechanism 18, the second nozzle 26, and the like, and prevents the processing on the sample W from being affected by the external environment.

Next, an example of a method of manufacturing a semiconductor device using the semiconductor manufacturing apparatus of this embodiment is described. An example case where the semiconductor device to be manufactured is a vertical power MOSFET (Metal Oxide Semiconductor Field Effect Transistor) that has a metal electrode on either surface of the semiconductor device and includes silicon (Si) is described below.

FIGS. 2A, 2B, 2C, 2D, 2E, 2F, and 2G are schematic cross-sectional diagrams showing the procedures in a device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a semiconductor substrate) 30 having a first surface (hereinafter referred to the front surface) and a second surface (hereinafter also referred to as the back surface). A protection film is then formed on the uppermost layer. The protection film is an inorganic insulating film such as a resin film made of polyimide or the like, a silicon nitride film, or a silicon oxide film. The silicon substrate 30 is preferably exposed through the surface of a dicing region formed on the front surface side.

Figure 2A:
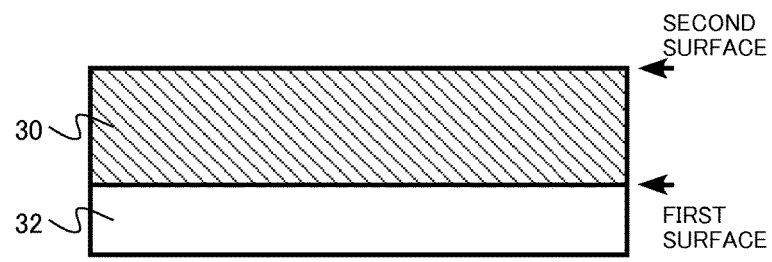
FIGS. 2A, 2B, 2C, 2D, 2E, 2F, and 2G are schematic cross-sectional diagrams showing the procedures in a device manufacturing method according to the first embodiment.

A supporting substrate 32 is then bonded to the front surface side of the silicon substrate 30 (FIG. 2A). The supporting substrate 32 is quartz glass, for example.

Figure 2B:
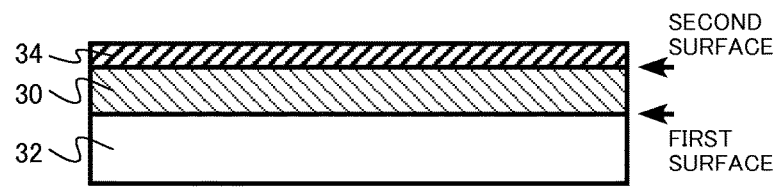

The back surface side of the silicon substrate 30 is ground, so that the silicon substrate 30 becomes thinner. A metal film 34 is then formed on the back surface side of the silicon substrate 30 (FIG. 2B).

The metal film 34 is the drain electrode of the MOSFET. The metal film 34 is formed with stacked films of different kinds of metals, for example. The metal film 34 is formed with stacked films of aluminum, titanium, nickel, and gold in this order from the back surface side of the silicon substrate 30, for example. The metal film 34 is formed by a sputtering technique, for example.

Figure 2C:

A resin sheet 36 is then bonded to the back surface side of the silicon substrate 30. The resin sheet 36 is a so-called dicing sheet. The resin sheet 36 is secured by a metal frame 38, for example. The resin sheet 36 is attached to the front surface of the metal film 34. The supporting substrate 32 is then removed from the silicon substrate 30 (FIG. 2C).

Figure 2D:
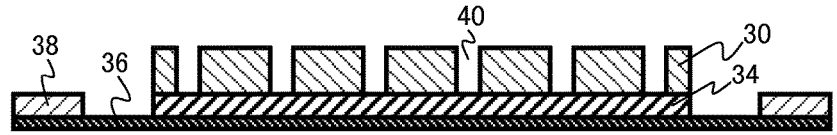

Grooves 40 are then formed in the silicon substrate 30 so that the metal film 34 on the back surface side is exposed through the front surface side along the dicing region formed on the front surface side of the silicon substrate 30 (FIG. 2D). Here, the dicing region is a reserved region having a predetermined width for dividing semiconductor chips by dicing, and is provided on the front surface side of the silicon substrate 30. The patterns of the semiconductor devices are not formed in the dicing region. The dicing region is provided on the front surface side of the silicon substrate 30, and is formed in a grid-like shape, for example.

The trenches 40 are formed by plasma etching, for example. The plasma etching is a so-called Bosch process in which an isotropic etching step using F-based radicals, a protection film forming step using $CF_4$-based radicals, and an anisotropic etching step using F-based ions are repeated, for example.

The trenches 40 are preferably formed by overall etching, with the mask being the protection film on the front surface side of the silicon substrate 30. This method does not involve lithography. Accordingly, the manufacturing process can be simplified, and the costs can be lowered.

Figure 2E:
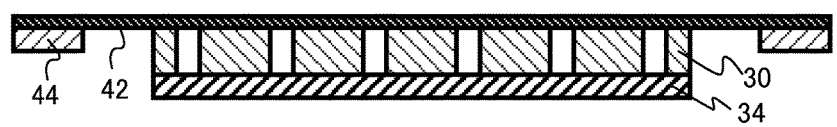

A resin sheet 42 is then bonded to the front surface side of the silicon substrate 30. The resin sheet 42 is a so-called dicing sheet. The resin sheet 42 is secured by a metal frame 44, for example. The resin sheet 42 is attached to the surfaces of the protection film and the metal electrodes on the front surface side. The resin sheet 36 on the back surface side is then removed (FIG. 2E).

Figure 2F:
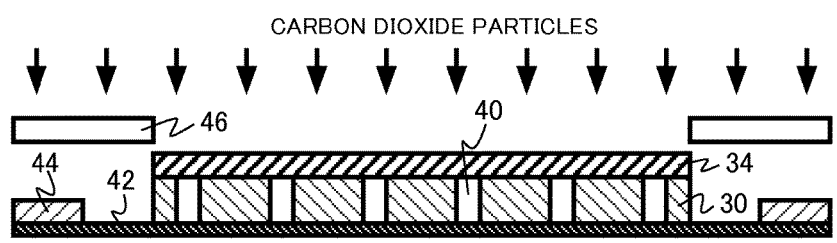

With the semiconductor manufacturing apparatus shown in FIGS. 1A and 1B, carbon dioxide particles are then injected onto the metal film 34 from the back surface side of the silicon substrate 30 (FIG. 2F). First, the frame 44 is placed on the stage 10 so that the resin sheet 42 is located on the surface of the stage 10 (FIGS. 1A and 1B). The stage 10 is then rotated by the rotation mechanism 14.

Water is supplied from the second nozzle 26 to the rotation center of the sample W. As water is supplied to the rotation center of the rotating sample W, a water coating is formed on the entire surface of the sample W. Carbon dioxide particles are then injected from the first nozzle 16, while the first nozzle 16 is linearly reciprocated in a direction perpendicular to the rotation axis of the stage 10 by the movement mechanism 18.

As the carbon dioxide particles are injected, the metal film 34 on the back surface side of the trenches 40 is removed. At this point, an opening is formed in the water coating on the surface of the sample W by the momentum of the gaseous matter containing the carbon dioxide particles injected from the first nozzle 16. As a result, removal of the metal film 34 is enabled. So as to form the opening in a stable manner, the direction of the injecting of the carbon dioxide particles from the first nozzle 16 is preferably almost perpendicular to the surface of the stage 10.

Figure 2G:

As the metal film 34 is removed, the silicon substrate 30 is divided into MOSFETs. By virtue of the carbon dioxide particles, the metal film 34 is scraped off into the trenches 40, and is thus removed (FIG. 2G).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are ejected together with a nitrogen gas or compressed air from the nozzle, and are injected onto the metal film 34. The mean particle size of the carbon dioxide particles is preferably not smaller than 10 μm and not greater than 200 μm. The spot diameter on the surface of the metal film 34 when the carbon dioxide particles are injected onto the metal film 34 is preferably not smaller than φ3 mm and not greater than φ10 mm, for example.

When the carbon dioxide particles are injected to remove the metal film 34, the region of the resin sheet 42 is preferably covered with a mask 46, as shown in FIG. 2F. As the region of the resin sheet 42 is covered with the mask 46, the resin sheet 42 can be restrained from coming off the frame 44 due to the impact caused by the carbon dioxide particles, for example. The mask 46 is made of a metal, for example.

After that, the resin sheet 42 on the front surface side of the silicon substrate 30 is removed. As a result, divided MOSFETs are obtained.

Next, the functions and the effects of the processing apparatus of this embodiment are described.

In a case where the metal film 34 is also formed on the back surface side of the silicon substrate 30 as in a vertical MOSFET, the metal film 34 on the back surface side in the dicing region also needs to be removed at the time of dicing. In a case where the semiconductor substrate 30 and the metal film 34 are simultaneously removed from the front surface side by blade dicing, for example, the portions of the metal film 34 at the edges of the trenches 40 in the dicing region curl toward the back surface side, and so-called burrs are formed.

If burrs are formed in the metal film 34, there is a possibility that the semiconductor chips will fail the external appearance test, and will not be turned into products, for example. Also, when the semiconductor chips and beds are joined with joining members such as solders, there is a possibility that soldering defects will be formed due to degraded adhesive properties at portions with burrs.

In the dicing using the semiconductor manufacturing apparatus of this embodiment, after the trenches 40 are formed along the dicing region of the silicon substrate 30, carbon dioxide particles are injected onto the metal film 34 from the back surface side, so that the portions of the metal film 34 located in the trenches 40 are removed. As the removed portions of the metal film 34 are scraped off into the trenches 40, formation of burrs is restrained. Only the portions of the metal film 34 at the portions corresponding to the trenches 40 can be removed in a self-aligning manner.

It is considered that the portions of the metal film 34 located over the trenches 40 are removed mainly by physical impact caused by carbon dioxide particles. In addition to that, it is considered that, as the metal film 34 is rapidly cooled by the low-temperature carbon dioxide particles, and the force generated by gasification and expansion of the carbon dioxide particles that have collided with the metal film 34 is applied, the effect to remove the metal film 34 by physical impact is increased.

Furthermore, in the semiconductor manufacturing apparatus of this embodiment, carbon dioxide particles are injected onto a sample placed on the rotating stage 10. Accordingly, carbon dioxide particles can be injected more evenly onto the surface of the sample than in a case where carbon dioxide particles are injected onto a sample placed on a fixed stage. Thus, the metal film 34 can be evenly removed.

Also, as carbon dioxide particles are injected onto a rotating sample, the velocity of the sample is added to the impact velocity of the carbon dioxide particles. Accordingly, the velocity at which the carbon dioxide particles collide with the metal film 34 becomes higher. Thus, the metal film 34 can be removed with high efficiency.

Figure 3:
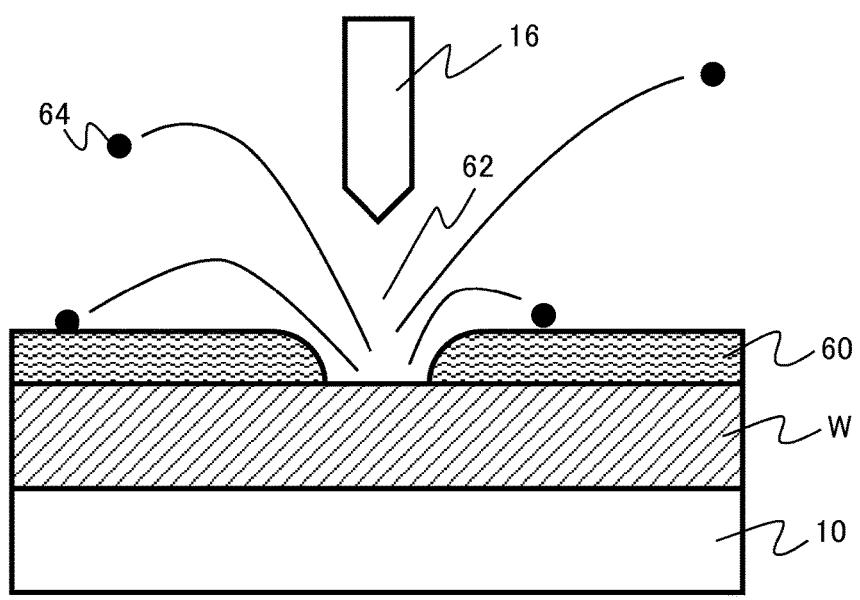
FIG. 3 is a diagram for explaining the functions of the processing apparatus according to the first embodiment.

FIG. 3 is a diagram for explaining a function of this embodiment. FIG. 3 is an enlarged schematic view of the region of the sample W onto which carbon dioxide particles are injected.

As water is supplied to the rotation center of the sample W from the second nozzle 26, a water coating 60 is formed on the entire surface of the sample W. An opening 62 is formed in the water coating 60 on the surface of the sample W by the momentum of the gaseous matter containing the carbon dioxide particles injected from the first nozzle 16.

At the opening 62, the metal film on the surface of the sample W is exposed, and the metal film is removed as the carbon dioxide particles collide with the metal film. At this point, particles 64 might scatter from the surface of the sample W. The particles 64 are fragments of the removed metal film, for example. Also, the particles 64 are foreign matter that adhered to the surface of the metal film, for example.

The scattered particles 64 might fall onto the surface of the sample W and adhere thereto, or enter the dicing trenches and turn into residues therein. As a result, when the semiconductor chips and beds are joined with joining members such as solders, voids or the like might be formed at the portions in which the particles 64 exist, and soldering defects might occur.

In this embodiment, on the other hand, the scattered particles 64 adhere to the water coating 60 on the surface of the sample W. Therefore, the particles 64 are removed together with the water flowing toward the outer circumference of the stage 10, by virtue of the rotation of the sample W. Accordingly, the particles 64 are prevented from adhering directly to the surface of the sample W. Thus, occurrence of soldering defects can be restrained.

As described above, with the processing apparatus of this embodiment, shape abnormalities in the metal film at the time of dicing can be restrained. Also, the metal film can be uniformly and efficiently removed at the time of dicing. Furthermore, particle adhesion can be prevented, and occurrence of soldering defects can be restrained.

In a case where a semiconductor device including a resin film in place of the metal film on the back surface side of the silicon substrate 30 is manufactured, the semiconductor manufacturing apparatus of this embodiment can also be used. In that case, carbon dioxide particles are injected to remove the resin film, instead of the metal film.

Second Embodiment

A processing apparatus of this embodiment is the same as the processing apparatus of the first embodiment, except for further including a baffle plate that surrounds the stage, and an air suction mechanism that generates an airflow between the stage and the baffle plate. Therefore, the same explanations as those in the first embodiment will not be repeated.

Figure 4:
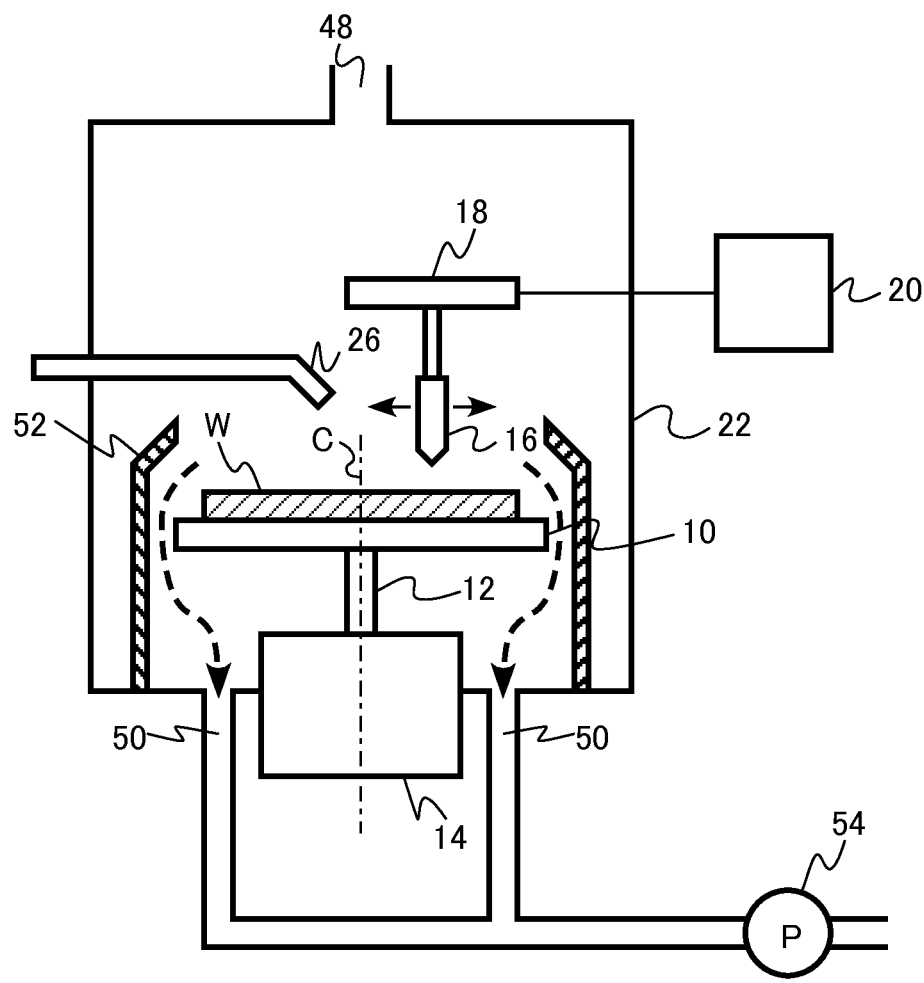
FIG. 4 is a schematic view of a processing apparatus according to a second embodiment.

FIG. 4 is a schematic view of the processing apparatus of this embodiment. FIG. 4 is a schematic view including a cross-section of the apparatus.

The semiconductor manufacturing apparatus of this embodiment includes an air inlet 48, air outlets 50, a baffle plate 52, and an air suction pump 54.

The air inlet 48 and the air outlets 50 are provided in the housing 22. The air inlet 48 is provided at an upper portion of the housing 22, for example, and the air outlets 50 are provided at lower portions of the housing 22, for example.

The air suction pump 54 is connected to the air outlets 50. The air suction pump 54 is a vacuum pump, for example. The air outlets 50 and the air suction pump 54 constitute an example of the air suction mechanism.

The baffle plate 52 is positioned to surround the stage 10. For example, the baffle plate 52 is positioned so that the top edge thereof is located over the upper surface of the stage 10. The baffle plate 52 is made of a metal or resin, for example.

Gaseous matter such as air or a nitrogen gas is supplied into the housing 22 through the air inlet 48, and is sucked into the air suction pump 54. In this manner, the gaseous matter is discharged through the air outlets 50. The gaseous matter flows downward in the housing 22. Accordingly, a so-called downflow can be formed in the housing 22.

Further, an airflow flowing downward in the housing 22 is formed between the stage 10 and the baffle plate 52, as indicated by the dashed lines accompanied by arrows in FIG. 4. Accordingly, the particles scattering when the metal film on the surface of the sample W is removed, or the mist containing the particles, can be effectively eliminated from the space above the upper surface of the sample W. Thus, the particles can be more strictly restrained from adhering to the surface of the sample W.

According to this embodiment, the particles generated when the metal film is removed with carbon dioxide particles, or the mist containing the particles, can be discharged through the air outlets 50 by the airflow formed in the housing 22. Accordingly, the removed metal film can be restrained from adhering to the sample W. Thus, occurrence of soldering defects can be further restrained.

Third Embodiment

A processing apparatus of this embodiment is the same as the processing apparatus of the first embodiment, except for further including a third nozzle that injects gaseous matter onto a sample. Therefore, the same explanations as those in the first embodiment will not be repeated.

Figure 5A:
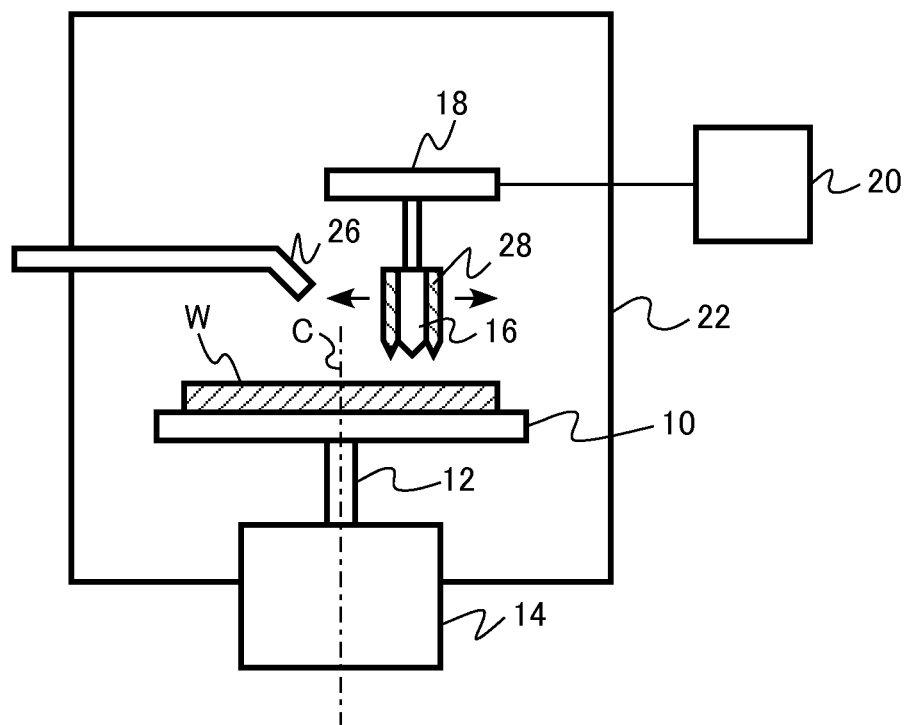
FIGS. 5A and 5B are schematic views of a processing apparatus according to a third embodiment.
Figure 5B:
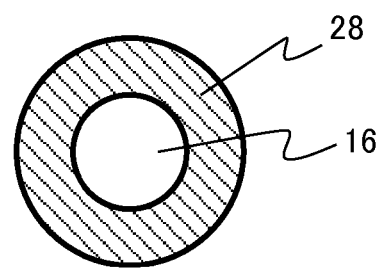

FIGS. 5A and 5B are schematic views of the processing apparatus of this embodiment. FIG. 5A is a schematic diagram including a cross-section of the apparatus. FIG. 5B is a cross-sectional view of the first and third nozzles.

The semiconductor manufacturing apparatus of this embodiment further includes a third nozzle 28. The third nozzle 28 injects gaseous matter onto the surface of a sample W. The gaseous matter is air or a nitrogen gas, for example.

The third nozzle 28 is provided along the outer circumference of the first nozzle 16, for example. As the third nozzle 28 is provided to inject gaseous matter onto the surface of the sample W, the formation of an opening in a water coating on the surface of the sample W is facilitated.

Modification

Figure 6:
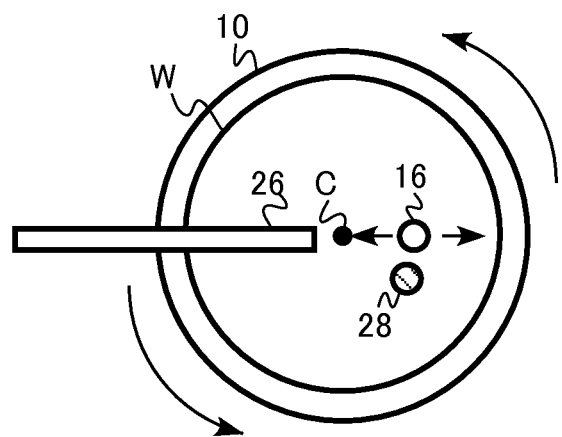
FIG. 6 is a schematic view of a processing apparatus according to a modification of the third embodiment.

FIG. 6 is a schematic view of a modification of the semiconductor manufacturing apparatus of this embodiment. FIG. 6 is a top view of the stage area of this modification. This modification differs from the embodiment in that the third nozzle 28 is provided separately from the first nozzle 16.

The third nozzle 28 is preferably located in the opposite direction of the direction of rotation of the stage 10 with respect to the first nozzle 16. In this modification, the formation of an opening in the water coating on the surface of a sample W is also facilitated.

Fourth Embodiment

A processing apparatus of this embodiment is the same as the processing apparatus of the first embodiment, except for further including a fourth nozzle that supplies fluid to a sample. Therefore, the same explanations as those in the first embodiment will not be repeated.

Figure 7:
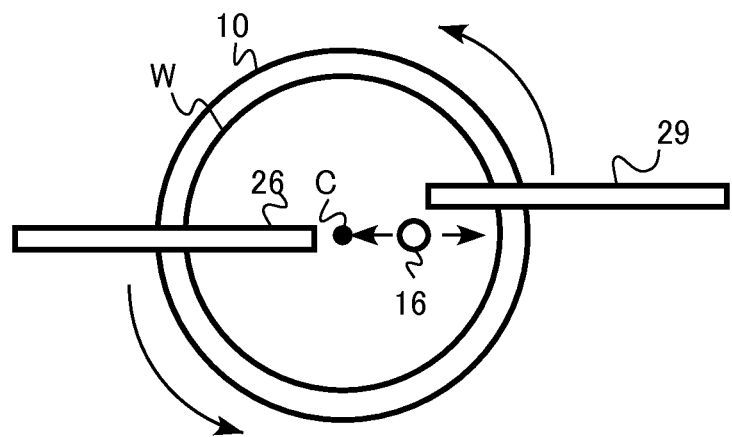
FIG. 7 is a schematic view of a processing apparatus according to a fourth embodiment.

FIG. 7 is a schematic view of the semiconductor manufacturing apparatus of this embodiment. FIG. 7 is a top view of the stage area of this embodiment.

The processing apparatus of this embodiment further includes a fourth nozzle 29 that supplies fluid to a sample W, as well as the second nozzle 26 that supplies fluid to the rotation center of the sample W. The fluid is water, for example.

As water is supplied to the surface of the sample W from the fourth nozzle 29, the time from the removal of the metal film with carbon dioxide particles until the closing of the opening formed in the water coating on the surface of the sample W can be shortened. Accordingly, particles are restrained from adhering to the surface of the sample W exposed at the opening.

So as to shorten the time until the closing of the opening, the fourth nozzle 29 is preferably located in the direction of rotation of the stage 10 with respect to the first nozzle 16.

Fifth Embodiment

A processing apparatus of this embodiment is the same as the processing apparatus of the first embodiment, except for further including a tilt mechanism that changes the angle of tilt of the first nozzle with respect to the surface of the stage. Therefore, the same explanations as those in the first embodiment will not be repeated.

Figure 8A:
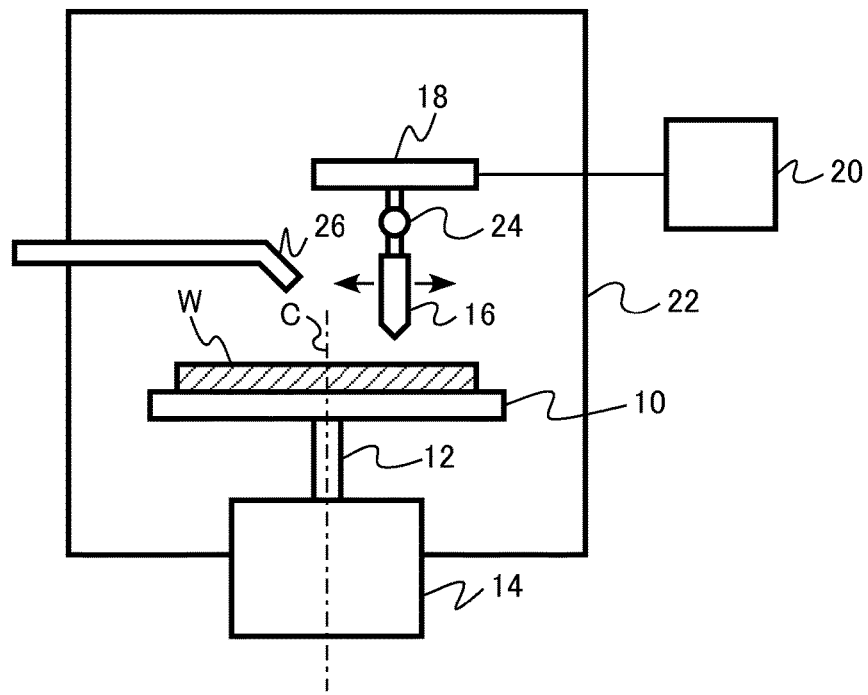
FIGS. 8A and 8B are schematic views of a processing apparatus according to a fifth embodiment.
Figure 8B:
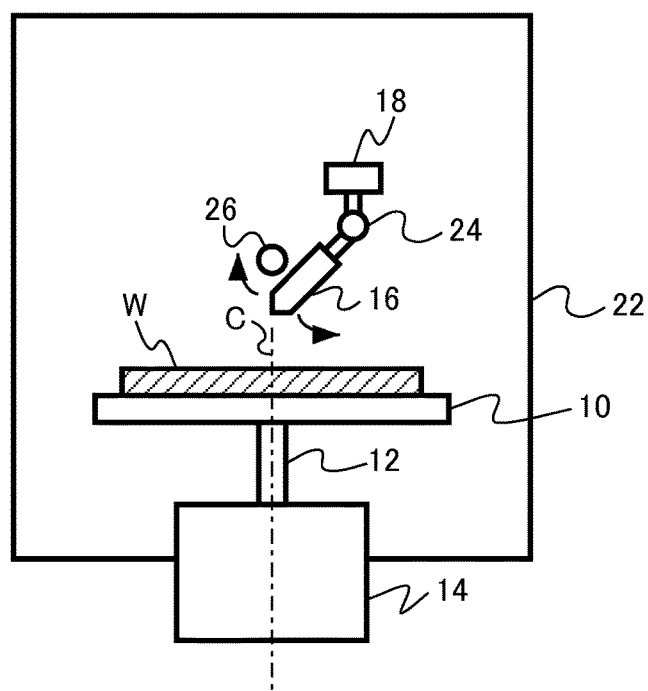

FIGS. 8A and 8B are schematic views of the processing apparatus of this embodiment. FIG. 8A is a schematic view including a cross-section of the apparatus. FIG. 8B is a schematic view including a cross-section in a direction perpendicular to the cross-section shown in FIG. 8A.

The semiconductor manufacturing apparatus of this embodiment includes a tilt mechanism 24. The tilt mechanism 24 changes the angle of tilt of the first nozzle 16 with respect to the surface of the stage 10. The angle of tilt of the tilt mechanism 24 is controlled by the control unit 20, for example.

The tilt mechanism 24 is a rotational tilt mechanism formed with a combination of a rotary shaft and a stepping motor, for example. The angle of tilt of the first nozzle 16 is preferably controlled so that the impact velocity of carbon dioxide particles colliding with the surface of a rotating sample W becomes higher than that in a case where the angle of tilt is 90 degrees. Specifically, the angle of tilt of the first nozzle 16 is preferably set so that the orientation of the injected carbon dioxide particles on the surface of the sample W is the opposite of the orientation of the rotational movement of the surface of the sample W.

By a manufacturing method using the semiconductor manufacturing apparatus of this embodiment, carbon dioxide particles are injected onto the sample W, while the angle of tilt of the first nozzle 16 with respect to the surface of the stage 10 is maintained at a smaller angle than 90 degrees, such as an angle not smaller than 15 degrees and not larger than 45 degrees.

According to this embodiment, the injecting of carbon dioxide particles has a horizontal-direction component with respect to the surface of the sample W. Therefore, the metal film or the resin film removed by the carbon dioxide particles does not easily enter the trenches for dicing. Accordingly, the removed metal film or resin film can be restrained from turning into residues in the trenches. Also, as the impact velocity of the carbon dioxide particles colliding with the sample W can be increased, the metal film 34 can be removed with higher efficiency. Furthermore, as the angle of tilt can be set at a desired value, an optimum processing condition for the sample W can be set.

Alternatively, the angle of tilt of the first nozzle 16 with respect to the surface of the stage 10 may be fixed at a smaller angle than 90 degrees. With this structure, the metal film or the resin film removed by the carbon dioxide particles can also be restrained from entering the trenches for dicing and turning into residues in the trenches. Also, as the impact velocity of the carbon dioxide particles colliding with the sample W can be increased, the metal film can be removed with even higher efficiency.

Sixth Embodiment

A processing apparatus of this embodiment is the same as the processing apparatus of the first embodiment, except for further including a movement mechanism that moves the stage and the second nozzle in a relative manner in a direction perpendicular to the rotation axis of the stage. Therefore, the same explanations as those in the first embodiment will not be repeated.

Figure 9A:
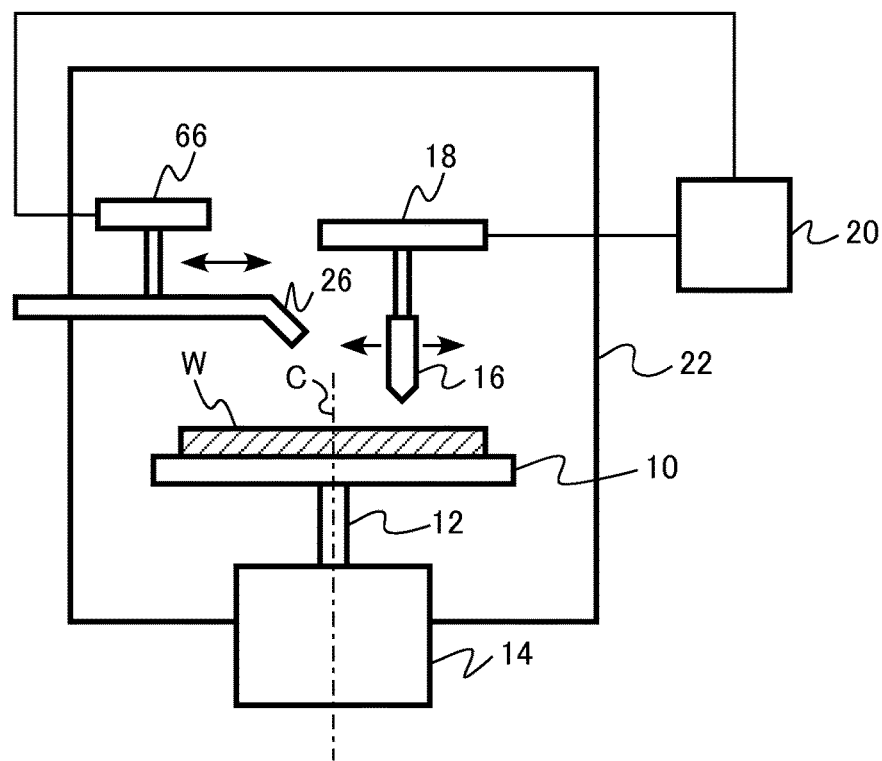
FIGS. 9A and 9B are schematic views of a processing apparatus according to a sixth embodiment.
Figure 9B:
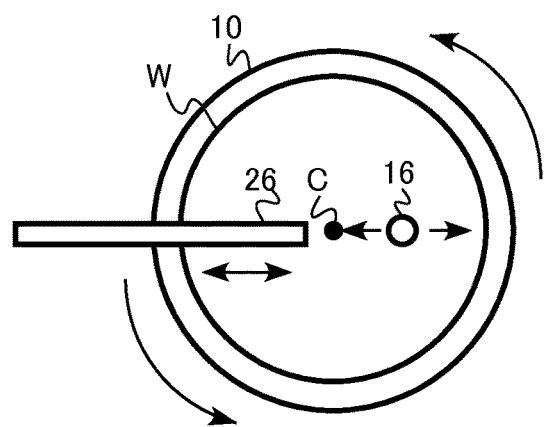

FIGS. 9A and 9B are schematic views of the processing apparatus of this embodiment. FIG. 9A is a schematic diagram including a cross-section of the apparatus. FIG. 9B is a top view of the stage area.

The semiconductor manufacturing apparatus of this embodiment further includes a movement mechanism (a second movement mechanism) 66.

The movement mechanism 66 is not particularly limited, as long as it can linearly scan the second nozzle 26 relative to the stage 10. For example, a belt-driven shuttle mechanism formed with a combining of a belt, a pulley, and a motor for rotating the pulley is used. Alternatively, a combination of a rack-and-pinion mechanism and a motor is used, for example. Also, a linear motor may be used, for example.

The movement mechanism 66 is controlled by the control unit 20, for example. The control unit 20 controls the scan range of the second nozzle 26 on the stage 10, the velocity of the second nozzle 26 relative to the stage 10, and the like to become desired values, for example.

As the second nozzle 26 is moved, a water coating can be evenly formed on the surface of the sample W.

Seventh Embodiment

A processing apparatus of this embodiment is the same as the processing apparatus of the first embodiment, except for including more than one first nozzle. Therefore, the same explanations as those in the first embodiment will not be repeated.

Figure 10:
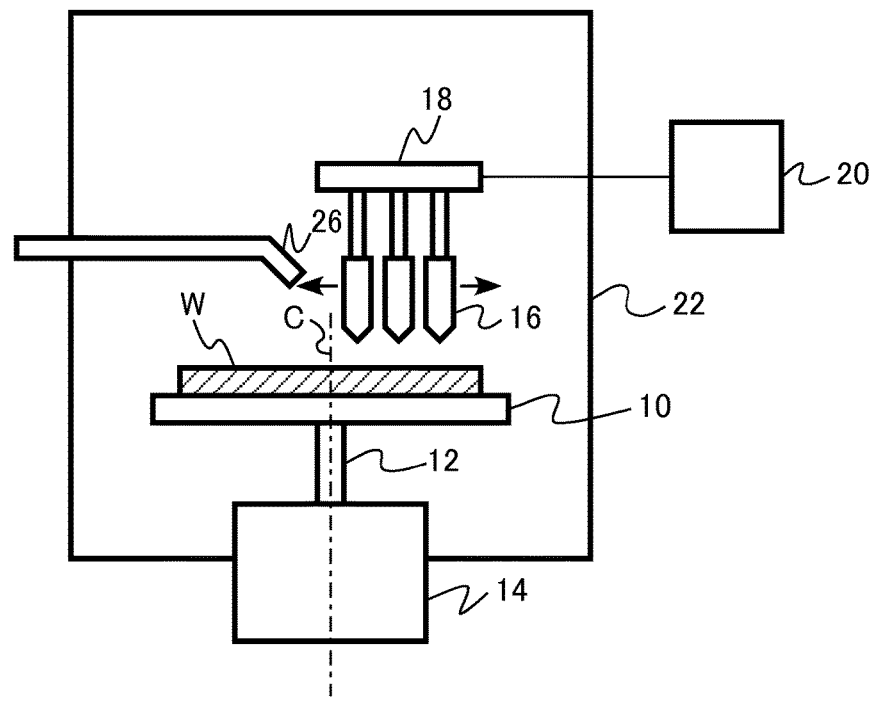
FIG. 10 is a schematic view of a processing apparatus according to a seventh embodiment.

FIG. 10 is a schematic view of the processing apparatus of this embodiment. FIG. 10 is a schematic view including a cross-section of the apparatus.

As shown in FIG. 10, the semiconductor manufacturing apparatus of this embodiment includes three first nozzles 16. The number of first nozzles 16 is not limited to three, as long as it is two or larger.

According to this embodiment, the productivity of processing can be increased by virtue of the first nozzles 16.

Eighth Embodiment

A processing apparatus of this embodiment is the same as the processing apparatus of the first embodiment, except that the direction of injecting of a substance from the first nozzle tilts in a direction toward the outer circumference of the stage. Therefore, the same explanations as those in the first embodiment will not be repeated.

Figure 11:
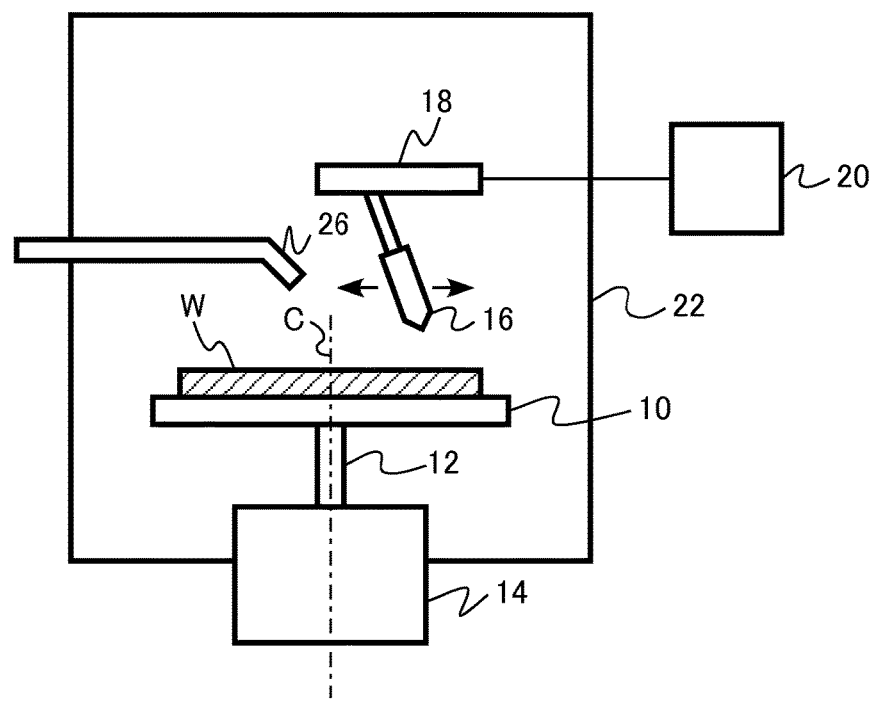
FIG. 11 is a schematic view of a processing apparatus according to an eighth embodiment.

FIG. 11 is a schematic view of the processing apparatus of this embodiment. FIG. 11 is a schematic view including a cross-section of the apparatus.

As shown in FIG. 11, in the semiconductor manufacturing apparatus of this embodiment, the direction of injecting of the substance from the first nozzle 16 tilts in a direction toward the outer circumference of the stage 10.

According to this embodiment, the particles scattering from the surface of the sample W, or the mist containing the particles, can be effectively eliminated from the space above the upper surface of the sample W. Thus, the particles can be more strictly restrained from adhering to the surface of the sample W.

In the first through eighth embodiments described above, the semiconductor devices are vertical MOSFETs. However, the semiconductor devices are not limited to vertical MOSFETs.

In the first through eighth embodiments, the metal film or the resin film is removed at the time of dicing. However, the processing apparatus of each of the embodiments can also be used in washing the surface of the semiconductor substrate, for example.

In the first through eighth embodiments, the substance to be injected is particles containing carbon dioxide. However, the substance to be injected may be some other substance, such as pressurized water, pressurized water containing abrasive grains, or particles other than carbon dioxide particles. It is also possible to use some other particles that are solid at the time of injecting from the nozzle but are gasified in an atmosphere in which a substrate is placed at ordinary temperature or the like. For example, it is possible to use nitrogen particles or argon particles.

Although semiconductor manufacturing apparatuses have been described as examples in the first through eighth embodiments, these embodiments can also be applied to a MEMS (Micro Electro Mechanical Systems) manufacturing apparatus.

In each of the example cases described in the first through eighth embodiments, a nozzle injects a substance to part of a sample, and the stage and the nozzle are moved in a relative manner so that the entire sample is processed. However, the nozzle can be designed to inject a substance to the entire surface of the sample so that the entire sample can be processed at once, for example. For example, a nozzle capable of processing an entire sample at once can be produced by adjusting the nozzle diameter to the size of the sample or combining a large number of nozzles.

While certain embodiments have been described, these embodiments have been presented by way of example only, and are not intended to limit the scope of the inventions. Indeed, the processing apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A processing apparatus comprising:
a stage capable of having a sample placed thereon;
a rotation mechanism configured to rotate the stage;
a first nozzle configured to inject gas including particles containing carbon dioxide onto the sample, the particles capable of removing a metal film or a resin film intentionally formed on the sample; and
a second nozzle disposed on a same side as the first nozzle with respect to the sample, the second nozzle configured to supply water to a rotation center of the sample prior to injection of the gas from the first nozzle, the second nozzle configured to form water coating on an entire surface of the sample,
wherein an opening is formed in the water coating by momentum of the gas, and the metal film or the resin film is exposed at the opening.

2. The apparatus according to claim 1, further comprising:
a movement mechanism configured to move the stage and the first nozzle in a relative manner in a direction perpendicular to a rotation axis of the stage; and
a control unit configured to control the movement mechanism.

3. The apparatus according to claim 1, further comprising:
a baffle plate surrounding the stage; and
an air suction mechanism configured to generate an airflow between the stage and the baffle plate.

4. The apparatus according to claim 1, further comprising
a third nozzle disposed on a same side as the first nozzle with respect to the sample, the third nozzle configured to inject gaseous matter onto the sample at a same time with the injection of the gas from the first nozzle.

5. The apparatus according to claim 4, wherein the third nozzle is provided along an outer circumference of the first nozzle.

6. The apparatus according to claim 4, wherein the third nozzle is provided separately from the first nozzle.

7. The apparatus according to claim 1, wherein a direction of injection of the gas from the first nozzle is substantially perpendicular to a surface of the stage.

8. The apparatus according to claim 1, wherein a mean particle size of the particles is not smaller than 10 μm and not greater than 200 μm.

9. The apparatus according to claim 1, further comprising
a fourth nozzle configured to supply liquid to the sample, the fourth nozzle being provided in a direction of rotation of the stage with respect to the first nozzle.

10. The apparatus according to claim 1, further comprising
a tilt mechanism configured to change an angle of tilt of the first nozzle with respect to a surface of the stage.

11. The apparatus according to claim 1, further comprising
a movement mechanism configured to move the stage and the second nozzle in a relative manner in a direction perpendicular to a rotation axis of the stage.

12. The apparatus according to claim 1, wherein a direction of injection of the gas from the first nozzle tilts in a direction toward an outer circumference of the stage.

* * * * *